United States Patent
Wang et al.

(10) Patent No.: US 6,492,227 B1
(45) Date of Patent: Dec. 10, 2002

(54) METHOD FOR FABRICATING FLASH MEMORY DEVICE USING DUAL DAMASCENE PROCESS

(75) Inventors: Li-Kong Wang, Montvale, NJ (US); Louis L. Hsu, Fishkill, NY (US); Wei Hwang, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/624,563

(22) Filed: Jul. 24, 2000

(51) Int. Cl.$^7$ .......................................... H01L 21/8234
(52) U.S. Cl. .................. 438/257; 438/201; 438/211; 438/258; 438/275; 438/279; 438/593
(58) Field of Search ................................ 438/257, 211, 438/201, 258, 275, 279, 593

(56) References Cited

U.S. PATENT DOCUMENTS

| | | |
|---|---|---|
| 5,120,670 A | 6/1992 | Bergmont |
| 5,151,760 A | 9/1992 | Gill et al. |
| 5,963,818 A | 10/1999 | Kao et al. |

OTHER PUBLICATIONS

T. Matsuki et al., "Cu/poly–Si Damascene Gate Structure MOSFET with Ta and TaN Stacked Barrier", IEEE Mar. 1999.

A. Yagishita et al., "Reduction of Threshold Voltage Deviation in Damascene Metal Gate MOSFETs", IEEE Mar. 1999.

Y. Yamauchi et al., "A 5V–Only Virtual Ground Flash Cell with An Auxiliary Gate for High Density and High Speed Application", IEEE Sep. 1999.

R. Kazerounian, et al., Alternate Metal Virtual Ground Eprom Array Implemented In A 0.8µm Process For Very High Density Applications, IEEE Sep. 1999.

R. Lambertson, et al., "A High–Density Dual–Polysilicon 5 Volt–Only Eeprom Cell", IEEE Sep. 1999.

*Primary Examiner*—Long Pham
(74) *Attorney, Agent, or Firm*—F. Chau and Associates, LLP; Robert M. Trepp

(57) ABSTRACT

A method is provided for fabricating memory devices on a semiconductor substrate using a dual damascene process. The method includes the steps of forming at least one dummy gate structure for at least one memory device on the semiconductor substrate, depositing dielectric material on surroundings of the at least one dummy gate structure, etching the dielectric material and the at least one dummy gate structure to form at least one control gate void and at least one floating gate void, forming a gate dielectric layer on a bottom surface of the at least one floating gate void, depositing floating gate material on the gate dielectric layer in the at least one floating gate void to form a floating gate, depositing a dielectric layer on the floating gate, and depositing control gate material on the dielectric layer in the at least one control gate void to form a control gate. Support devices may be fabricated on the semiconductor substrate by a single damascene process this is integrated with the processes of fabricating the memory devices, so that top surfaces of the support devices and the memory devices are substantially coplanar.

25 Claims, 6 Drawing Sheets

METHOD FOR FABRICATING FLASH MEMORY DEVICE USING DUAL DAMASCENE PROCESS

BACKGROUND OF THE INVENTION

1. Field of the Invention

The present invention relates to a method of manufacturing memory devices, and more particularly, to a method for fabricating memory devices using a dual damascene process and support devices using a single damascene process on a common semiconductor substrate.

2. Description of the Related Art

Flash memory devices, such as erasable and programmable read-only memory (EPROM) devices and electrically erasable and programmable read-only memory (EEPROM) devices, generally have a structure such that a control gate of a flash memory device is disposed on top of a floating gate of the flash memory device. In a conventional flash memory device, a floating gate is first formed and then a control gate is formed on top of the floating gate. Due to such a structure, a conventional flash memory device has a non-planar surface. In other words, the surface (particularly, the top surface of a control gate) of a flash memory device is higher than that of a support device. When patterning a control gate of a flash memory device, the surface of the flash memory device is not planar due to existence of a floating gate of the flash memory device. Such a non-planar surface of a flash memory device causes a patterning problem in lithography and/or an etching process for fabricating flash memory devices. For example, in lithography for a flash memory device, lithography resolution is deteriorated due to non-planar (i.e., high topography) surface of the flash memory device. Such a lithography resolution can be improved when the surface of the flash memory device has relatively less topography. Also, it is difficult in an etching process to optimize an etching selectivity between materials to be removed and not to be removed due to a high topography of a memory device surface. The etching selectivity may be improved as the surface of a flash memory device is flatter, and be optimized in case of having a flat surface.

Thus, in a process of fabricating a conventional flash memory device, an extra process is required to planarize the non-planar surface of a flash memory device. The planarization of the surface of a flash memory device may advantageously induce a high quality metallic interconnection between a flash memory device and support devices, thereby achieving a high-density integration of the devices.

In a conventional flash memory device, properties of a gate dielectric layer of a flash memory device are different from those of support devices. A support device is a device disposed outside a memory array area. The support devices may include, for example, decoder circuits, sense amplifiers, drivers, and so on. Such differences in the properties between a flash memory device and support devices are inevitable because a flash memory device requires either hot-carrier injection or electron tunneling to program a floating gate of the flash memory device. In this case, the gate dielectric layer of a flash memory device has to be constantly programmed for an injection of electrons, whereas supporting devices do not require such a constraint.

In a conventional approach, this problem may be solved by fabricating each device independently on a common semiconductor substrate by separate processes. For example, a support device is formed by a first process, and then a flash memory device is formed by another process. This approach generally causes a significant increase in the process cost. Also, the conventional approach is highly complex for fabricating a flash memory integrated with support devices. Thus, it is difficult to improve yield for such a process.

Therefore, a need exists for a method of fabricating flash memory devices and support devices through an integrated process on a common semiconductor substrate, where the surfaces of the flash memory devices and the support devices are substantially coplanar. Further, it will be advantageous to enhance density and capability of integration of memory and support devices by employing the present invention for fabricating the devices together in an integrated process.

SUMMARY OF THE INVENTION

It is an object of the present invention to provide a method for fabricating memory devices on a common semiconductor substrate using a dual damascene process.

It is another object of the present invention to provide a method for fabricating memory devices and support devices together by an integrated process, wherein the memory devices and the support devices are formed by a dual damascene process and a single damascene process, respectively.

It is also another object of the present invention to provide a method for fabricating memory devices of which surfaces are substantially coplanar with those of support devices interconnected with the memory devices.

To achieve the above and other objects, the present invention provides a method for fabricating a flash memory by use of a dual damascene process, comprising the steps of forming at least one dummy gate structure for at least one memory device on the common semiconductor substrate, depositing dielectric material surrounding the at least one dummy gate structure on the common semiconductor substrate, etching the dielectric material and the at least one dummy gate structure to form at least one control gate void and at least one floating gate void for the at least one memory device, forming a gate dielectric layer on a bottom surface of the at least one floating gate void, depositing floating gate material on the gate dielectric layer in the at least one floating gate void to form a floating gate of the at least one memory device, depositing a dielectric layer on the floating gate, and depositing control gate material on the dielectric layer in the at least one control gate void to form a control gate of the at least one memory device. The etching step preferably includes the steps of recessing the at least one dummy gate structure to form a recessed dummy floating gate with a predetermined height from the common semiconductor substrate, forming resist masks on the dielectric material deposited at the surroundings of the at least one dummy gate structure, selectively etching the dielectric material to form the at least one control gate void, and removing the recessed dummy floating gate to form the at least one floating gate void. The etching step may alternatively include the steps of removing the at least one dummy gate structure by an etching to form at least one void area, forming an oxide layer on a bottom surface of the at least one void area, depositing polysilicon material on the oxide layer to form a dummy floating gate with a predetermined height in the at least one void area, forming resist masks on the dielectric material deposited at the surroundings of the at least one dummy gate structure, selectively etching the dielectric material to form the at least one control gate void, and removing the dummy floating gate to form the at least one floating gate void. The etching step may also include the step of forming step edges between the at least one control gate void and the at least one floating gate void.

The method of the present invention may further include the steps of forming at least one gate conductor structure for at least one support device on the common semiconductor substrate, and depositing dielectric material at surroundings of the at least one gate conductor structure on the common semiconductor substrate. The step of forming the at least one gate conductor structure preferably includes the steps of forming a gate oxide layer of the at least one support device on the common semiconductor substrate, depositing control gate material on the gate oxide layer to form a control gate of the at least one support device, and forming a cap layer of the at least one support device on a top surface of the control gate material. The at least dummy gate structure for the at least one memory device and the at least one gate conductor structure for the at least one support device are formed an integrated process, including the steps of forming a gate oxide layer of the at least one dummy gate structure and the gate oxide layer of the at least one support device by a same process flow, depositing dummy material of the at least one dummy gate structure and the control gate material of the at least one support device by a same process flow, and forming a cap layer of the at least one dummy gate structure and the cap layer of the at least one support device by a same process flow.

The present invention also provides a method for fabricating memory devices on a common semiconductor substrate, comprising the steps of forming at least one dummy gate structure for at least one memory device on the semiconductor substrate, depositing dielectric material at surroundings of the at least one dummy gate structure on the common semiconductor substrate, removing the at least one dummy gate structure to form a void area on the common semiconductor substrate, forming a gate dielectric layer on a bottom surface of the void area, depositing floating gate material on the gate dielectric layer in the void area, forming resist masks on the dielectric material deposited at the surroundings of the at least one dummy gate structure, non-selectively etching the dielectric material and the floating gate material to form a floating gate and a control gate void, depositing a dielectric layer on the floating gate, and depositing control gate material on the dielectric layer in the control gate void to form a control gate.

The present invention further provides a memory circuit having a plurality of memory cells formed on a common semiconductor substrate, wherein a memory cell comprising a channel region for the memory cell formed in the common semiconductor substrate, a gate oxide layer formed on the channel region, the gate oxide layer having a thickness unique to the memory cell, a floating gate formed on the gate oxide layer, where the floating gate having a predetermined thickness, a dielectric layer formed on the floating gate, and a control gate formed on the dielectric layer. The memory circuit preferably further includes at least one support device formed on the common semiconductor substrate by a process integrated with forming the memory device, wherein the at least support device includes a gate oxide layer having properties substantially equal to those of the gate oxide layer of the memory cell, a control gate formed on the gate oxide layer, the control gate having properties substantially equal to those of the floating gate of the memory cell, and a cap layer formed on the control gate. Preferably, top surfaces of the memory cells and the support devices are substantially coplanar.

These and other objects, features and advantages of the present invention will become apparent from the following detailed description of illustrative embodiments thereof, which is to be read in connection with the accompanying drawings.

BRIEF DESCRIPTION OF THE DRAWINGS

This disclosure will present in detail the following description of preferred embodiment with reference to the following figures wherein.

DESCRIPTION OF PREFERRED EMBODIMENTS

Detailed illustrative embodiments of the present invention are disclosed herein. However, specific structural and functional details disclosed herein are merely representative for purposes of describing preferred embodiments of the present invention.

The present invention relates to a method for fabricating memory devices and support devices on a common semiconductor substrate using double and single damascene processes, respectively. One of the advantages of the present invention is that source and drain regions of a memory device are first formed using a dummy gate structure for the memory device, and a gate dielectric layer and a gate conductor of the memory device are formed later. As a result, a gate dielectric layer in a memory device is subject to less thermal cycle and less damage, compared to a conventional memory device.

In a method for fabricating memory devices according to the invention, metallic material having lower melting temperature (for example, aluminum or copper having melting temperature lower than 500° C.) may be used (e.g., deposited) for a gate conductor of a memory device, because the formation of source and drain regions requiring higher temperatures (e.g., higher than 900° C.) is performed prior to formation of a gate conductor of a memory device. Compared with a conventional method of fabricating memory devices where source and drain regions are formed after forming a gate conductor of a memory device so as to cause more diffusion of implanted dopant and larger parasitic capacitance, the present invention prevents such diffusion of implanted dopant and parasitic capacitance by forming a gate conductor after completing a formation of source and drain regions of a memory device.

It is another advantage of the present invention that a control gate of a flash memory device is formed on a floating gate such that there is no offset between the control and floating gates, so that any possibility of loading due to parasitic capacitance may be eliminated. Also, in a conventional method of fabricating a memory device, a control gate can offset to an edge of a floating gate (forming "overhang" structure) due to a misalignment in patterning the control and floating gates, which is typically performed in different lithography printing and etching processes. Such an overhang structure causes more parasitic capacitance. Compared with this, in a method of the present invention, control and floating gates of a memory device are formed using a dual damascene process so that there is no offset between the control and floating gates. As a result, no parasitic capacitance is induced due to the overhang structure.

FIGS. 1 through 7 are perspective cross-sectional views for illustrating a method of fabricating a gate conductor of a flash memory device using a dual damascene process. FIGS. 8 through 15 are cross-sectional views for illustrating an integrated process to form a flash memory device and a support device together.

Figure 1:
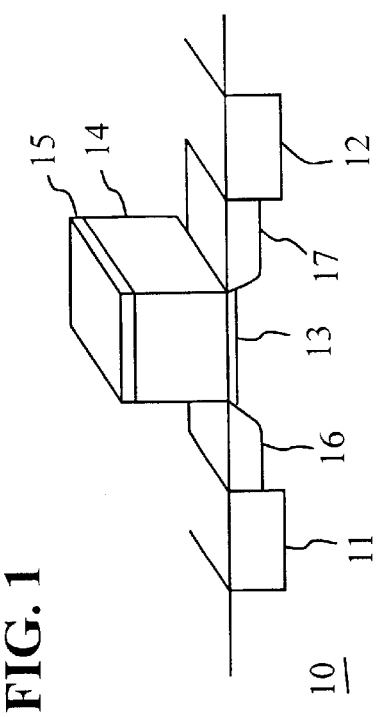
FIG. 1 is a perspective cross-sectional view illustrating formation of a dummy gate structure in an active area of a flash memory device.

Referring to FIG. 1, there is provided a dummy gate structure for a flash memory device. In a semiconductor substrate (e.g., silicon) 10, an active area is formed between shallow trenches 11, 12. A gate oxide layer 13 is formed in the active area, and a dummy gate structure 14 for a gate conductor of the flash memory device is formed on the gate oxide layer 13. The dummy gate structure 14 is formed of, for example, polysilicon. The gate oxide layer 13 is a sacrificial dielectric layer, which will be removed in a following process. A thin cap layer 15 is formed on top of the dummy gate structure 14. The thin cap layer 15 is formed of, for example, nitride. Source and drain regions 16, 17 of the flash memory device are formed by performing a proper ion implantation process, which is well known to those skilled in the art. It should be noted that the formation of source and drain regions 16, 17 is performed prior to processes to form a gate conductor of a flash memory device.

Figure 2:
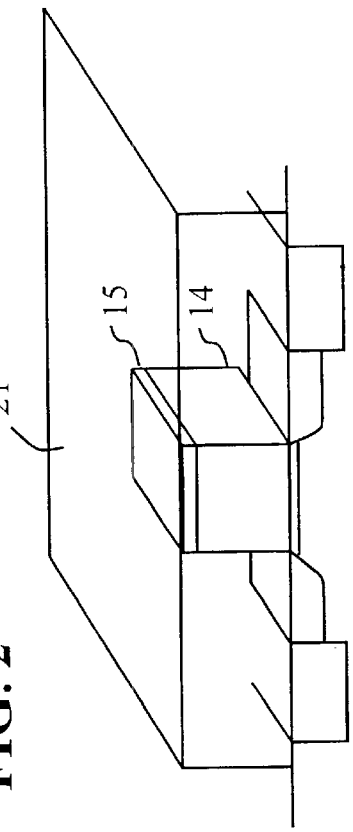
FIG. 2 is a perspective cross-sectional view illustrating deposition of dielectric material at surroundings of the structure in FIG. 1.

Referring to FIG. 2, dielectric material 21, for example doped glass, is deposited at surroundings of the dummy gate structure 14 and the cap layer 15 on the semiconductor substrate. The dielectric material 21 is then planarized such that surfaces of the dielectric material 21 and the thin cap layer 15 become substantially coplanar. In the planarization of the dielectric material 21, the thin cap layer 15 of nitride serves as an etch stop to protect the polysilicon of the dummy gate structure 14 from etching.

As preferred embodiments of the present invention, three approaches will be provided to form a flash memory device. The three approaches will be described particularly with reference to FIGS. 3A, 3B, and 12A and B, respectively.

Figure 3A:
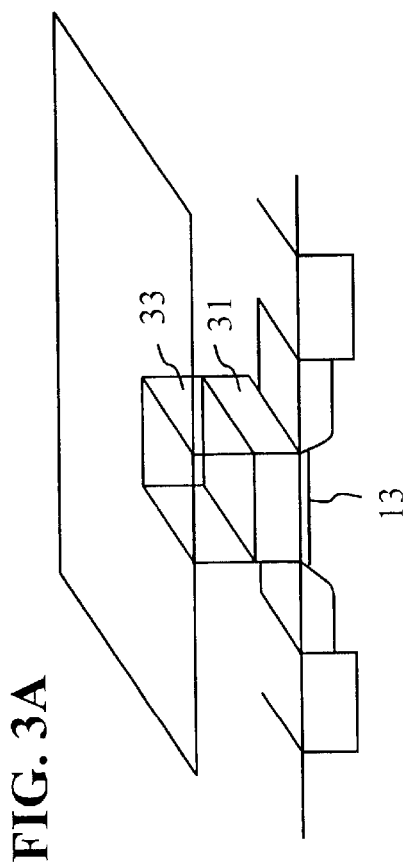
FIG. 3A is a perspective cross-sectional view illustrating a first approach to form a dummy floating gate of a memory device.

Referring to FIG. 3A, a first approach to form a self-aligned flash memory device adopts a self-aligned process to prevent an offset between two layers due to misalignment between two photo-lithography processing steps. The thin cap layer 15 (referring to FIGS. 1 and 2) is removed by, for example, a blank etch to selectively etch nitride of the thin cap layer 15 without affecting oxide layer. After removing the thin cap layer 15, the dummy gate structure 14 (referring to FIGS. 1 and 2) is recessed by, for example, a timed etch (e.g., an etch performed by etching at a given rate for a period of time) to form a recessed dummy gate structure 31. As a result of the recessing, a void area 33 is formed on top of the recessed dummy gate structure 31. The void area 33 is preferably about half the size of the dummy gate structure 14. The recessed dummy gate structure 31 will be used as a dummy floating gate of the flash memory device. This first approach is continued in FIG. 4.

Figure 3B:
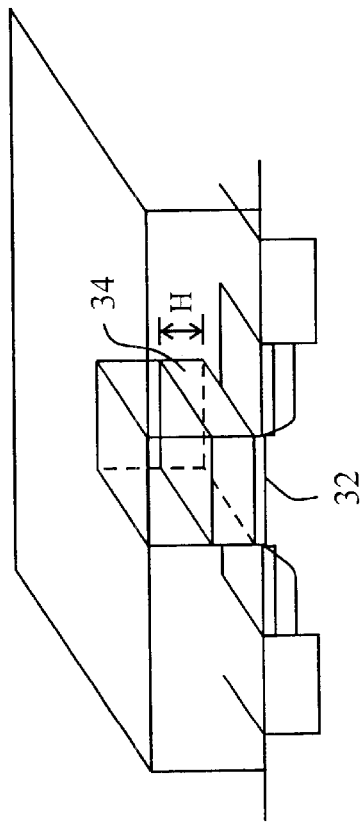
FIG. 3B is a perspective cross-sectional view illustrating a second approach to form a dummy floating gate of a memory device.

Referring to FIG. 3B, there is provided a second approach to form a self-aligned flash memory device. The thin cap layer 15, the dummy gate structure 14, and the gate oxide layer 13 (referring to FIG. 1) are successively removed by a blank etch. Then, a new oxide layer 32, such as a tunneling oxide, for a flash memory device is formed in the area where the gate oxide layer 13 has been removed. The new oxide layer 32 is preferably different from the removed gate oxide layer 13 in thickness and/or properties of the layers. It is also noted that a support device (which will be described in reference to FIGS. 8 to 16) may have a gate oxide layer, a control gate, and a thin cap layer which are substantially equal in properties to the gate oxide layer 13, the dummy gate structure 14, and the thin cap layer 15, respectively.

After forming the oxide layer 32, doped polysilicon material is deposited on the oxide layer 32. The doped polysilicon material is then recessed by an etching process to form a polysilicon gate 34. The recess is formed to the extent that the polysilicon gate 34 has a predetermined height H. The polysilicon gate 34 with a predetermined height H will be used as a dummy floating gate of the flash memory device.

Figure 4:
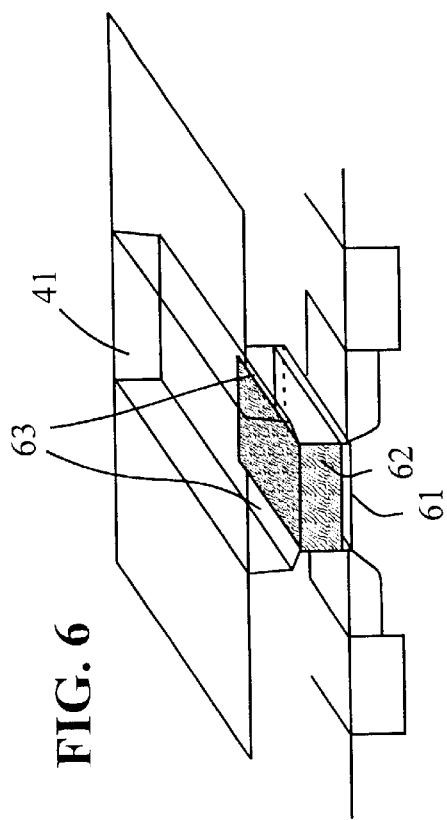
FIG. 4 is a perspective cross-sectional view illustrating formation of resist masks on the dielectric material.

The first and second approaches described in FIGS. 3A and 3B, respectively, are continued in FIG. 4. Referring to FIG. 4, a control gate area 41 is defined by patterning resist masks 42 on top of the dielectric material 21. In forming the control gate area 41, it is not sensitive that the control gate area 41 is slightly misaligned with area of a dummy floating gate 43. In other words, a width of the control gate area 41 may be slightly wider or narrower than that of the dummy floating gate 43.

Figure 5:
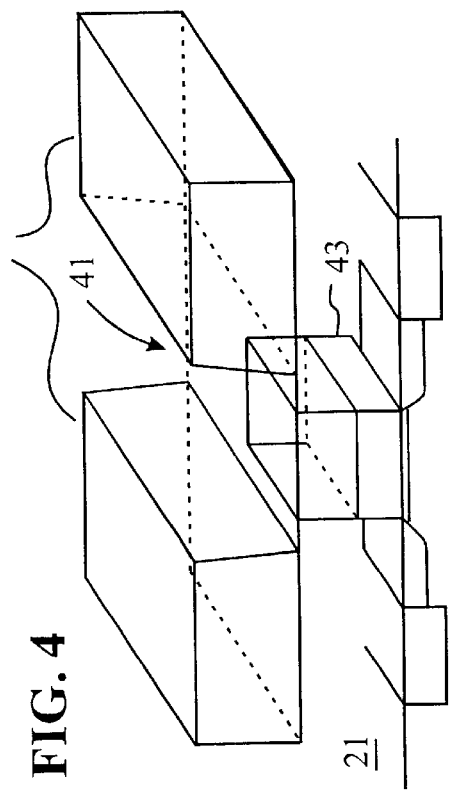
FIG. 5 is a perspective cross-sectional view illustrating formation of a control gate area.

Referring to FIG. 5, after forming the control gate area 41 by a selective oxide etching, the etching further proceeds to remove the dielectric material 21 to the extent of top of the dummy floating gate 43. As a result of the etching, the bottom surface of the control gate area 41 becomes coplanar with the top surface of the dummy floating gate 43. The dummy floating gate 43 is then removed to form a void area 51. To remove the polysilicon of the dummy floating gate 43, wet etching or isotropic etching may be used. A protective oxide layer, which is the gate oxide layer 13 in the first approach (referring to FIG. 3A) or the flash memory oxide layer 32 in the second approach (referring to FIG. 3B), is removed and a gate dielectric layer 61 (referring to FIG. 6) is formed for the flash memory device.

Figure 6:
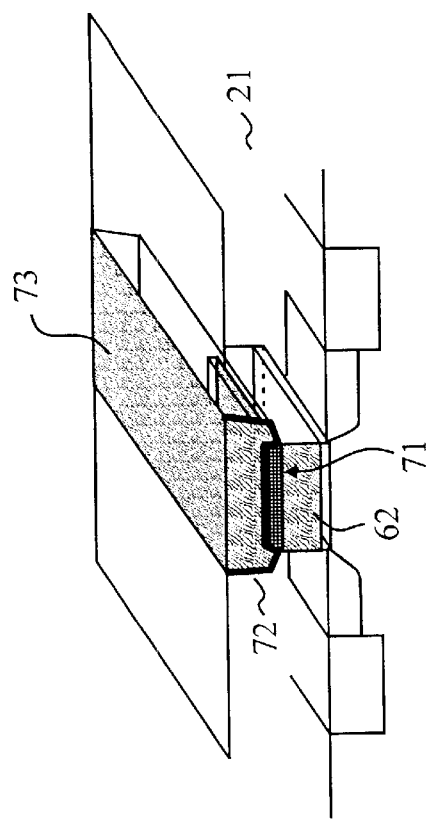
FIG. 6 is a perspective cross-sectional view illustrating formation of a floating gate.

Referring to FIG. 6, doped polysilicon is deposited on top of the gate dielectric layer 61 in the void area 51. The gate dielectric layer 61 is preferably different from the gate oxide layer 13 (referring to FIG. 1) and/or the flash memory oxide layer 32 (referring to FIG. 3B) in thickness and/or properties of the layers. The deposition of the doped polysilicon may be performed, for example, by a dep-etch process. The dep-etch process is a process including conformable deposition and dry etching to fill a void area. The doped polysilicon deposited in the void area 51 becomes a floating gate 62 of the flash memory device. Preferably, the doped polysilicon of the floating gate 62 is slightly recessed below step edges 63 between the control gate area 41 and the floating gate 62 to prevent the doped polysilicon of the floating gate 62 (i.e., floating gate material) from overfilling. It should be noted that even if a small amount of the floating gate material is overfilled, it does not cause any problem because the overflown floating gate material is oxidized in a later process.

Figure 7:
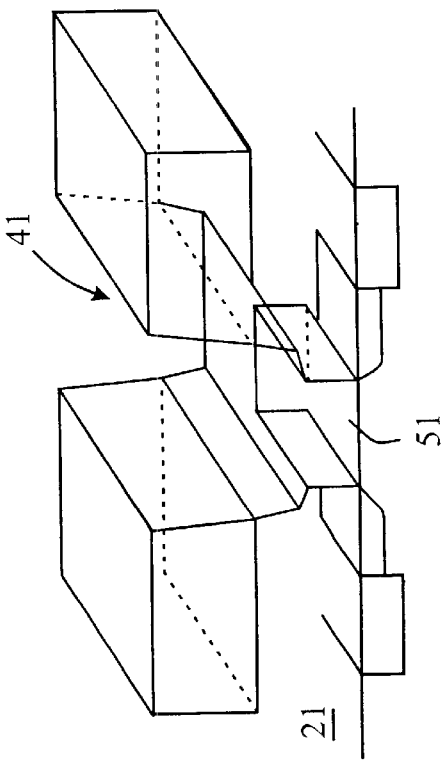
FIG. 7 is a perspective cross-sectional view illustrating formation of a control gate.

Referring to FIG. 7, the exposed surface of the floating gate 62 is oxidized by, for example, thermal oxidization to form an oxide layer 71. Thin nitride layer 72 is then deposited on top of the oxide layer 71 and the surfaces, including the sidewall surfaces, of the control gate area. The thin nitride layer 72 serves as an inter-poly dielectric layer between two polysilicon gates, that is, the floating gate 62 and a control gate 73. Doped polysilicon is deposited in the control gate area by, for example, a chemical vapor deposition (CVD) process to form the control gate 73. The polysilicon of the control gate 73 is polished back to the top surface of the dielectric material 21. Preferably, the width of the control gate 73 is slightly wider than that of the floating gate 62. It is noted that a coupling ratio between the inter-poly dielectric and the gate dielectric layer 61 is ensured by making the width of the control gate 73 wider than that of the floating gate 62.

As mentioned above, FIGS. 8 through 15 are cross-sectional views for illustrating an integrated process to form a flash memory device and a support device, together. For convenience sake in the description, there is provided one support device in FIGS. 8 to 15. It is, however, noted that multiple support devices may be integrated with one or more flash memory devices. The support devices may include, for example, decoder circuits, sense amplifiers, drivers, and so on. It is also noted that as being described below, a flash memory device of the present invention is fabricated by a dual damascene process, while a support device integrated with the flash memory device is formed by a single damascene process. The integration of a flash memory device and a support device includes metallic interconnection between the devices.

Figure 8:
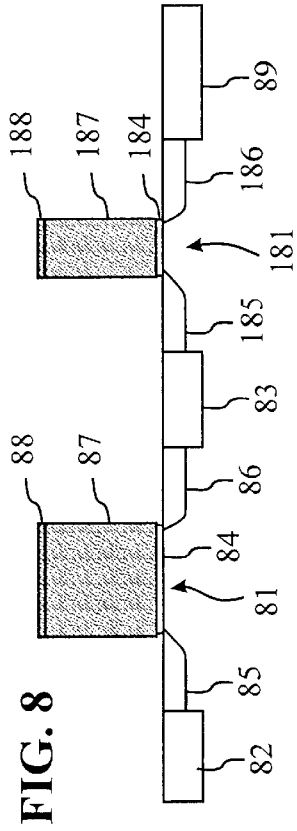
FIG. 8 is a cross-sectional view illustrating formation of a dummy gate structure for a memory device and a structure for a support device.

Referring to FIG. 8, a dummy structure for a flash memory device and a support device are formed. A dummy structure 81 is disposed between shallow trench isolations 82, 83 and includes an oxide layer 84, source and drain regions 85, 86, and a dummy gate conductor 87 formed of polysilicon. The dummy gate conductor 87 has on its top a thin cap layer 88 formed of nitride. A support device 181 is disposed between shallow trench isolations 83, 89 and includes an oxide layer 184, a control gate 187, a thin cap layer 188, and source and drain regions 185, 186. The support device 181 preferably has identical materials with those of the dummy structure for a flash memory device 81. In other words, the control gate 187 is formed of polysilicon and the thin cap layer 188 is formed of nitride. The oxide layer 184 of the support device 181 preferably has the same thickness and/or properties as those of the oxide layer 84 of the dummy structure 81. It should be noted that doping properties of the dummy structure 81 and the support device 181 may be the same or different, and that the diagram does not represent any proportion of the sizes of the devices.

Figure 9:
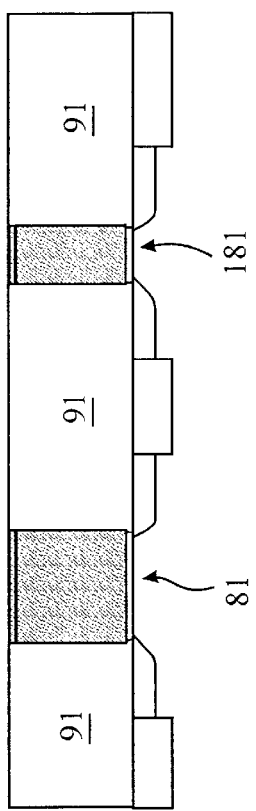
FIG. 9 is a cross-sectional view illustrating deposition of dielectric material at surroundings of the structures in FIG. 8.

Referring to FIG. 9, surroundings of the dummy structure 81 and the support device 181 are filled with dielectric material to form a thick dielectric layer 91. The dielectric layer 91 is then planarized so that the top surfaces of the dielectric layer 91, dummy flash memory device 81, and the support device 181 are substantially coplanar. The planarization may be performed by, for example, a chemical-mechanical polish process.

Figure 10:
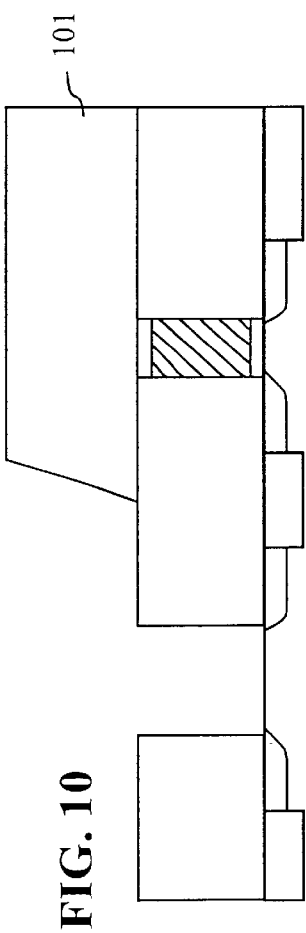
FIG. 10 is a cross-sectional view illustrating formation of a void area by removing the dummy gate structure for a memory device.

Referring to FIG. 10, the dummy structure for a memory device 81 is completely removed. The thin cap layer 88, the dummy gate conductor 87, and the oxide layer 84 of the dummy structure 81 are sequentially removed by a series of etching steps. At the time of removing the dummy structure 81, the support device 181 is protected by a block out mask 101. After removing the dummy structure 81, a flash memory device is formed by one of two alternative processes, which are illustrated in FIGS. 11 and 12, respectively.

Figure 11A:
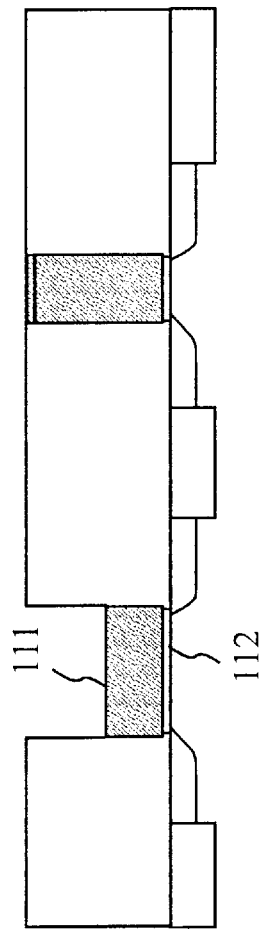
FIGS. 11A and 11B are cross-sectional views illustrating formation of a floating gate of a memory device.
Figure 11B:
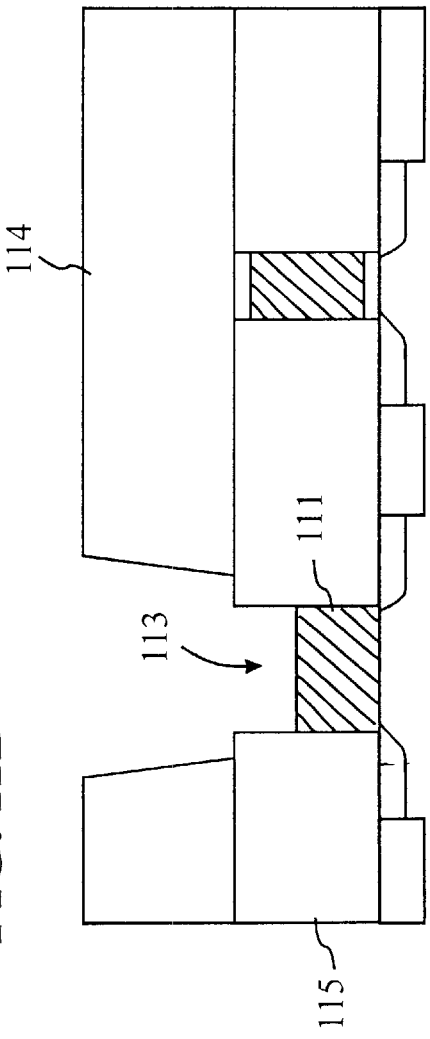

Referring to FIG. 11A, a flash oxide layer 112 and a floating gate 111 is formed in a void area where the dummy structure 81 has been removed. The flash oxide layer 112 is formed in the area where the oxide layer 84 has been removed. The oxide layer 112 has a thickness and properties, which are preferably different from those of the oxide layer 84. The floating gate 111 is then formed by a similar process as the floating gate 34 in FIG. 3B. In other words, doped polysilicon is deposited on top of the oxide layer 112, and is recessed to a predetermined depth to form the floating gate 111. After forming the floating gate 111, referring to FIG. 11B, a control gate area 113 is defined by patterning resist masks on the surface of the dielectric material 115. The dielectric material 115 is removed by a selective etching process, which etches dielectric material but not the polysilicon (refer to FIG. 13).

Figure 12A:
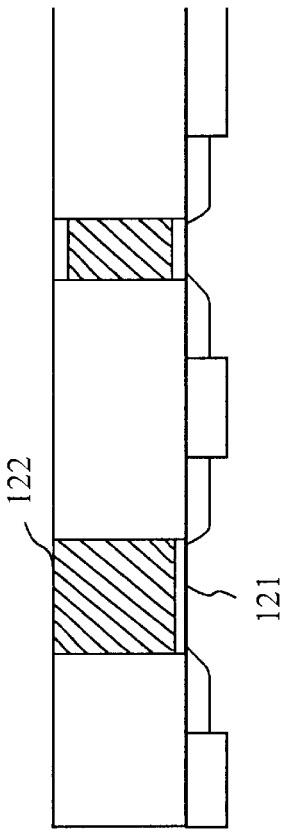
FIGS. 12A and 12B are cross-sectional views illustrating a third approach to form a floating gate of a memory device.
Figure 12B:
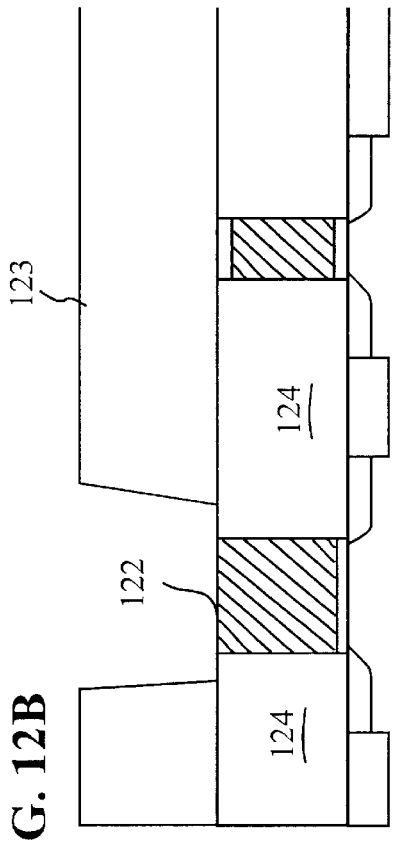
Figure 13:
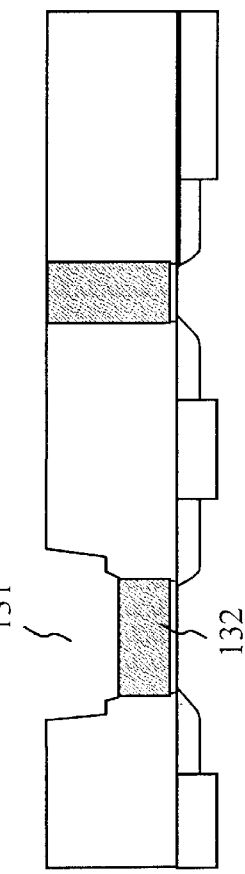
FIG. 13 is a cross-sectional view illustrating formation of a control gate area and a floating gate.

Referring to FIG. 12A, there is provided a third approach of forming a flash memory device of the present invention. In the void area where the dummy structure 81 has been removed as shown in FIG. 10, a flash oxide layer 121 is formed, and then doped polysilicon material 122 is deposited on top of the flash oxide layer 121. Unlike the flash memory device in FIG. 11A, the doped polysilicon in FIG. 12A is not recessed. Referring to FIG. 12B, resist masks 123 are patterned on the surface of the dielectric material 124 to form a control gate area 131 (refer to FIG. 13). In this case, a non-selective etching is used to etch the doped polysilicon 122 and the dielectric material 124 at a same etching rate. It should be noted that a non-selective etching process is adopted in FIG. 12B to etch together the doped polysilicon 122 and the dielectric material 124, whereas a selective etching process is adopted in FIG. 11B to selectively remove the dielectric material 115. As a result of either the selective etching process or the non-selective etching process, a control gate area 131 and a floating gate 132 are formed as shown in FIG. 13.

Figure 14:
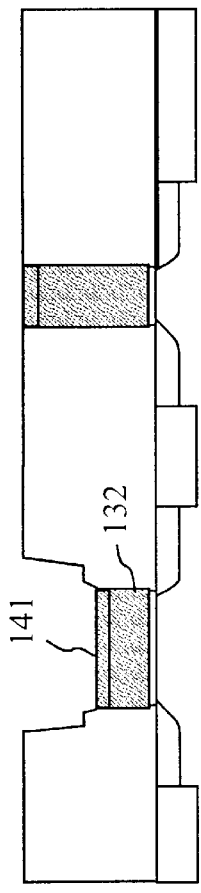
FIG. 14 is a cross-sectional view illustrating formation of an oxide layer on top of the floating gate.
Figure 15:
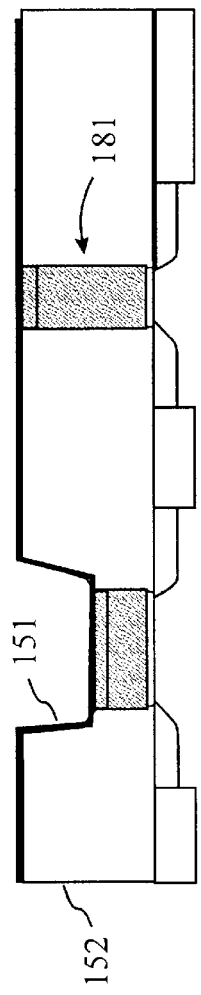
FIG. 15 is a cross-sectional view illustrating formation of a dielectric layer on the surfaces of the oxide layer, dielectric material, and a support device.

Referring to FIG. 14, an oxide layer 141 is formed on top of the floating gate 132 by oxidizing the surface of the floating gate 132. After forming the oxide layer 141, another dielectric layer 151 is formed as shown in FIG. 15. The dielectric layer 151 is preferably formed on the horizontal and vertical surfaces of the oxide layer 141, the dielectric material 152, and the support device 181. The support device 181 is protected by being covered with the dielectric layer 151. The dielectric layer 151 is preferably a thin nitride layer.

Figure 16:
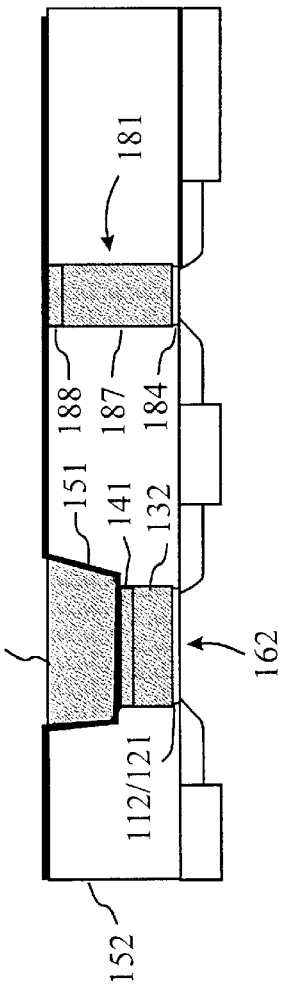
FIG. 16 is a cross-sectional view illustrating formation of a control gate of a memory device.

Referring to FIG. 16, a control gate 161 is formed by depositing polysilicon on the top of the dielectric layer 151. The deposited polysilicon of the control gate 161 is polished back to the extent that the surfaces of the control gate 161 and the dielectric material 152 become coplanar. During the polish process, the support device 181 is covered with and protected by the dielectric layer 151.

Therefore, a flash memory device 162 is formed with the flash oxide layer 112 or 121, the floating gate 132, the oxide layer 141, the dielectric layer 151, and the control gate 161 using a dual damascene process, and the support device 181 is formed with the oxide layer 184, the control gate 187, and the thin cap layer 188 using a single damascene process. The flash memory device 162 and the support device 181 are formed together by an integrated process. Also, the surfaces of the flash memory device and the support device are coplanar. Such a coplanarity of the surfaces of the devices may advantageously induce a high quality metallic interconnection between the flash memory device and the support device, thereby achieving higher density integration of the devices.

Having described preferred embodiments of a method for fabricating a flash memory device according to the present invention, modifications and variations can be readily made by those skilled in the art in light of the above teachings. It is therefore to be understood that, within the scope of the appended claims, the present invention can be practiced in a manner other than as specifically described herein.

What is claimed is:

1. A method for fabricating memory devices on a common semiconductor substrate, comprising the steps of:
   (a) forming at least one dummy gate structure for at least one memory device on the common semiconductor substrate;
   (b) depositing dielectric material surrounding the at least one dummy gate structure on the common semiconductor substrate;
   (c) etching the dielectric material and the at least one dummy gate structure to form at least one control gate void and at least one floating gate void for the at least one memory device;
   (d) forming a gate dielectric layer on a bottom surface of the at least one floating gate void;
   (e) depositing floating gate material on the gate dielectric layer in the at least one floating gate void to form a floating gate of the at least one memory device;
   (f) depositing a dielectric layer on the floating gate; and
   (g) depositing control gate material on the dielectric layer in the at least one control gate void to form a control gate of the at least one memory device.

2. The method as defined in claim 1, wherein the step (c) includes the steps of:
   recessing the at least one dummy gate structure to form a recessed dummy floating gate with a predetermined height from the common semiconductor substrate;
   forming resist masks on the dielectric material deposited at the surroundings of the at least one dummy gate structure;
   selectively etching the dielectric material to form the at least one control gate void; and
   removing the recessed dummy floating gate to form the at least one floating gate void.

3. The method as defined in claim 1, wherein the step (c) includes the steps of:
   removing the at least one dummy gate structure by an etching to form at least one void area;
   forming an oxide layer on a bottom surface of the at least one void area;
   depositing polysilicon material on the oxide layer to form a dummy floating gate with a predetermined height in the at least one void area;
   forming resist masks on the dielectric material deposited at the surroundings of the at least one dummy gate structure;
   selectively etching the dielectric material to form the at least one control gate void; and
   removing the dummy floating gate to form the at least one floating gate void.

4. The method as defined in claim 1, further including before the step (a) the step of forming source and drain regions for the at least one memory device in the common semiconductor substrate.

5. The method as defined in claim 1, wherein the step (a) includes the steps of:
   forming a dummy oxide layer of the at least one dummy gate structure on the common semiconductor substrate;
   depositing polysilicon material on the dummy oxide layer to form a dummy body of the at least one dummy gate structure; and
   forming a cap layer on surface of the polysilicon material.

6. The method as defined in claim 5, wherein the cap layer serves as an etch stop layer for protecting the polysilicon material during planarizing the dielectric material deposited in the step (b).

7. The method as defined in claim 1, wherein the step (c) includes the step of forming step edges between the at least one control gate void and the at least one floating gate void.

8. The method as defined in claim 7, wherein the at least void control gate area is wider than the at least one floating gate void at least as much as the step edges.

9. The method as defined in claim 7, wherein the step (e) includes the step of recessing the floating gate material below the step edges.

10. The method as defined in claim 1, further including between the steps (e) and (f) the step of forming an oxide layer on the floating gate by an oxidation process, whereby the dielectric layer is deposited on the oxide layer on the floating gate.

11. The method as defined in claim 1, wherein the floating gate material and the control gate material are doped polysilicon.

12. The method as defined in claim 11, wherein the dielectric layer deposited on the floating gate is an inter-poly dielectric layer formed of nitride.

13. The method as defined in claim 1, wherein the step (f) includes the step of depositing the dielectric layer on inner surfaces of the at least one control gate void.

14. The method as defined in claim 1, further including the steps of:
   (h) forming at least one gate conductor structure for at least one support device on the common semiconductor substrate; and
   (i) depositing dielectric material at surroundings of the at least one gate conductor structure on the common semiconductor substrate.

15. The method as defined in claim 14, wherein the step (h) includes the steps of:

forming a gate oxide layer of the at least one support device on the common semiconductor substrate;

depositing control gate material on the gate oxide layer to form a control gate of the at least one support device; and forming a cap layer of the at least one support device on a top surface of the control gate material.

16. The method as defined in claim 15, wherein surfaces of the cap layer and the dielectric material deposited in the step (i) are substantially coplanar.

17. The method as defined in claim 14, wherein surfaces of the at least one dummy gate structure formed in the step (a), the dielectric material deposited in the step (b), the at least one gate conductor structure formed in the step (h), and the dielectric material deposited in the step (i) are substantially coplanar.

18. The method as defined in claim 15, wherein the step (a) and the step (h) are performed by an integrated process, wherein the integrated process includes the steps of:

forming a gate oxide layer of the at least one dummy gate structure and the gate oxide layer of the at least one support device by a same process flow;

depositing dummy material of the at least one dummy gate structure and the control gate material of the at least one support device by a same process flow; and forming a cap layer of the at least one dummy gate structure and the cap layer of the at least one support device by a same process flow.

19. The method as defined in claim 14, further including after the step (i) the step of:

(j) depositing a dielectric layer on a top surface of the at least one support device.

20. The method as defined in claim 19, wherein the step (f) and the step (j) are performed by a same process flow.

21. A method for fabricating memory devices on a common semiconductor substrate, comprising the steps of:

(a) forming at least one dummy gate structure for at least one memory device on the semiconductor substrate;

(b) depositing dielectric material at surroundings of the at least one dummy gate structure on teh common semiconductor substrate;

(c) removing the at least one dummy gate structure to form a void area on the common semiconductor substrate;

(d) forming a gate dielectric layer on a bottom surface of the void area;

(e) depositing floating gate material on the gate dielectric layer in the void area;

(f) forming resist masks on the dielectric material deposited at the surroundings of the at the least one dummy gate structure;

(g) etching the dielectric material and the floating gate material to form a floating gate and a control gate void;

(h) depositing a dielectric layer on the floating gate; and (i) depositing control gate material on the dielectric layer in the control gate void to form a control gate.

22. The method as defined in claim 21, further including before the step (a) the step of forming source and drain regions for the at least one memory device in the common semiconductor substrate.

23. The method as defined in claim 21, further including the steps of:

(j) forming at least one gate conductor structure for at least one support device on the common semiconductor substrate in a same process flow of performing the step (a); and (k) depositing dielectric material at surroundings of the at least one gate conductor structure on the common semiconductor substrate in a same process flow of performing the step (b).

24. The method as defined in claim 23, wherein surfaces of the at least one dummy gate structure formed in the step (a), the dielectric material deposited in the step (b), the at least one gate conductor structure formed in the step (j), and the dielectric material deposited in the step (k) are substantially coplanar.

25. The method as defined in claim 21, wherein the step (g) includes the step of forming step edges between the control gate void and the floating gate by forming the control gate void wider than the floating gate.

* * * * *